(12) United States Patent
Goth

(10) Patent No.: US 7,370,247 B2
(45) Date of Patent: May 6, 2008

(54) DYNAMIC OFFSET COMPENSATION BASED ON FALSE TRANSITIONS

(75) Inventor: Bjarke Goth, Roskilde (DK)

(73) Assignee: Intel Corporation, Santa Clara, CA (US)

( * ) Notice: Subject to any disclaimer, the term of this patent is extended or adjusted under 35 U.S.C. 154(b) by 276 days.

(21) Appl. No.: 11/238,170

(22) Filed: Sep. 28, 2005

(65) Prior Publication Data

US 2007/0074086 A1 Mar. 29, 2007

(51) Int. Cl.
*H03M 13/00* (2006.01)

(52) U.S. Cl. ............... 714/709; 714/2; 714/48; 714/704; 714/705; 714/713; 714/724; 714/745; 714/798; 714/817; 714/818; 714/819; 375/316; 370/395.61; 370/497; 327/40

(58) Field of Classification Search ............ None
See application file for complete search history.

(56) References Cited

U.S. PATENT DOCUMENTS

| | | | | |
|---|---|---|---|---|
| 4,535,459 A * | 8/1985 | Hogge, Jr. | ............... | 375/324 |
| 6,002,723 A * | 12/1999 | Chethik | ............... | 375/317 |
| 6,847,789 B2 * | 1/2005 | Savoj | ............... | 398/155 |
| 6,909,852 B2 * | 6/2005 | Cao | ............... | 398/155 |
| 7,016,613 B2 * | 3/2006 | Savoj | ............... | 398/155 |
| 7,190,906 B2 * | 3/2007 | Cao | ............... | 398/155 |
| 7,209,525 B2 * | 4/2007 | Laturell et al. | ............... | 375/316 |
| 2004/0268190 A1 * | 12/2004 | Kossel et al. | ............... | 714/704 |

FOREIGN PATENT DOCUMENTS

JP 356169479 A * 12/1981

OTHER PUBLICATIONS

"10 Gbit/s Receiver, CDR and DeMUX GD16544", *Data Sheet Rev.:06*, (Giga—an Intel Company), (2001), 17 pgs.
"2.5 Gbit/s Clock and Data Recovery GD16522", *Data Sheet Rev.: 21*, (Giga—an Intel Company), (2001), 12 pgs.
"2.5 Gbit/s Clock and Data Recovery GD16547", *Data Sheet Rev.: 12*, (Giga—an Intel Company),(2001), 9 pgs.
"2.5 Gbit/s Transponder Chip Set with Digital "Wrapping" GD16556/GD16557", *Data Sheet Rev.: 23*, (Giga—an Intel Company), (2002), 28 pgs.
"Intel® LXT16725—10gbps 1:1 Signal Conditioning Transceiver for XFP Optical Applications", *Intel® Product Brief, Order No. 301482-001*, (2004), 7 pgs.
Hsieh, M.-T., et al., "Clock and Data Recovery With Adaptive Loop Gain for Spread Spectrum SerDes Applications", *IEEE International Symposium on Circuits and Systems (ISCAS 2005)*, (2005), 4883-4886.
Lee, M.-J. E., et al., "CMOS High-Speed I/O's—Present and Future", *Proceedings of the 21st International Conference on Computer Design (ICCD '03)*, (2003), 8 pgs.

(Continued)

*Primary Examiner*—John P Trimmings
(74) *Attorney, Agent, or Firm*—Schwegman, Lundberg & Woessner, P.A.

(57) ABSTRACT

A method and apparatus provide a receiver with an architecture to regulate a bit error rate of the receiver using an offset based on detecting false transitions in received data. In an embodiment, such false transitions in data may be determined in a bang-bang detector.

28 Claims, 3 Drawing Sheets

OTHER PUBLICATIONS

Musa, F. A., et al., "Clock Recovery in High-Speed Multilevel Serial Links", [online]. Department of Electrical and Computer Engineering, University of Toronto. [archived Dec. 16, 2004]. Retrieved from the Internet: <URL: http://web.archive.org/web/20041216020641/http://www.eecg.utoronto.ca/~tcc/ssmmse_slides.pdf>, 16 pgs.

Perrott, M. H., "6.076 High Speed Communication Circuits and Systems; Lecture 21—MSK Modulation and Clock and Data Recovery Circuits", *MITOPENCOURSEWARE*, (Massachusetts Institute of Technology),(2003), 43 pgs.

Perrott, M. H., "PLL Design Using the PLL Design Assistant Program", (Microsystems Technology Laboratories, Massachusetts Institute of Technology), (Apr. 2, 2005), 33 pgs.

\* cited by examiner

DYNAMIC OFFSET COMPENSATION BASED ON FALSE TRANSITIONS

TECHNICAL FIELD

Embodiments of the invention relate generally to receivers.

BACKGROUND

In communication systems, an incoming signal may be distorted with noise. In an optical system, for example, the distortion from noise may be due to inherent nonlinear properties of an optical fiber. The noise may cause data errors since a "1" may be taken to be a "0" and vice versa. Enhanced techniques to compensate for such noise may provide improved operational performance.

DESCRIPTION

Figure 1:
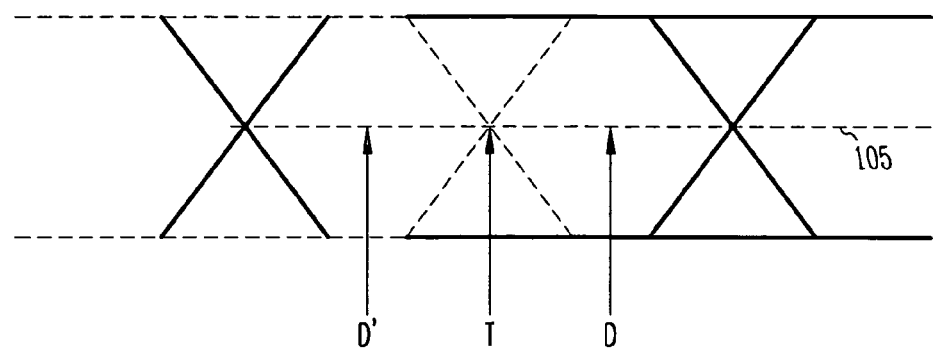
FIG. 1 shows an embodiment of two data bits separated by a transition sampled in a bang-bang phase detector.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments can be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

In an embodiment, a method for dynamic compensation for adjusting a sampling position within a receiver may include detecting false transitions of data in a receiver and regulating a bit error rate of the receiver using an offset. The offset may be based on the detection of the false transitions. The offset may be used to adjust a threshold to identify a bit as a one or a zero such as to regulate the bit error rate of the receiver. The threshold may be adjusted according to the amount of noise on the ones and zeros. In an embodiment, a false transition may occur when a transition bit between two data bits has a bit value different from a bit value common to the two data bits.

In various communication systems, noise may be associated with an incoming signal to a receiver in the communication system. In optical systems, for instance, the incoming signal may often be distorted with noise due to the inherent nonlinear properties of optical fiber used as a communication medium. In addition, more noise may be present for one of the bit representations ('0's or '1's) than the other. In addition to noise, additional offsets detrimental to receiver or system operation may occur in various apparatus within the receiver or the system. In an optical system, the optical-to-electrical (O/E) converter that changes the received light to electrical signals can have built-in voltage offsets. The O/E converter may include a photodetector and a transimpedance amplifier. The photodetector may include a device with a structure having a p-type semiconductor material connected to intrinsic semiconductor that is connected to n-type semiconductor material, typically referred to as a PIN device. The O/E converter may be calibrated when the module is produced such that offsets may be removed. However, typical modules may not have a form of regulation of the bit sampling position for a receiver placed in service.

In an embodiment, adjustments to a bit sampling position may be made using an Alexander based phase detector, also known as a bang-bang detector. Herein, the term bang-bang detector is used. The bang-bang detector may be used in a clock data recovery (CDR) system of an optical receiver. Other components of a receiver CDR may include a limiting amplifier (LIA) and a voltage controlled oscillator (VCO).

FIG. 1 shows an embodiment of two data bits separated by a transition sampled in a Bang-Bang phase detector. Data may be sampled to provide a transition bit, T, between two data bits, D and D'. FIG. 1 shows the bits D, T, D' relative to a threshold level 105. The signals may be provided by a phase detector, where D' is a data signal, D is the previous data signal, and T corresponds to a transition level.

Figure 2:
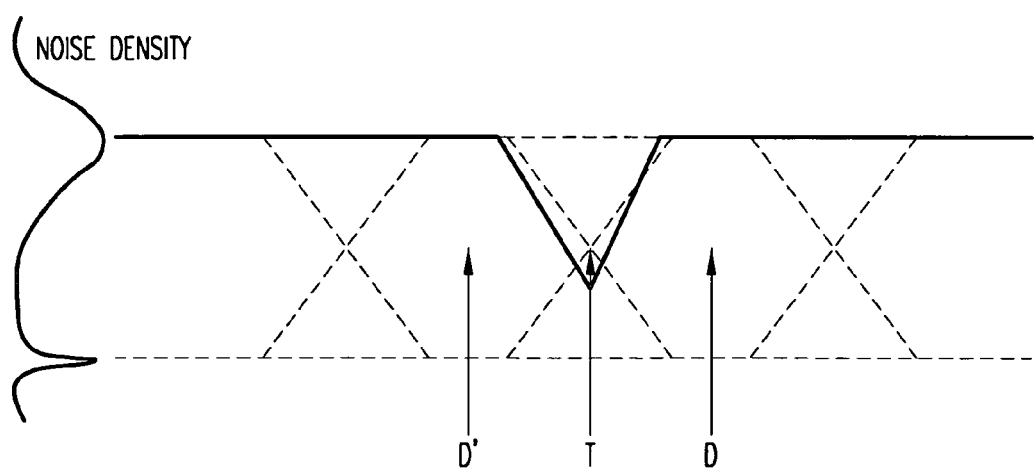
FIG. 2 shows an embodiment of two data bits separated by a transition having a false transition as sampled in a bang-bang phase detector.

FIG. 2 shows an embodiment of two data bits separated by a transition having a false transition as sampled in a bang-bang phase detector caused by the occurrence of some noise density. For a bang-bang detector, a false transition occurs when the two data bits, D and D', are identical, that is, the two data bits have the same digital value, but the transition bit is not identical to the data bits. This may be taken to indicate that the input signal has noise and that the noise amplitude is sufficient to change the transition bit. The impact of such noise to the sampled data bit may result in bit errors. For example, FIG. 2 may be taken to indicate that the input data signal has more noise on ones than on zeros and that a better sample position may be to have the threshold at a lower voltage. If D and D' are not equal, then the data is taken to have been in transition, which is the phase detected value.

In an embodiment, sampled data may be examined to detect false transitions. If false transitions occur, an adjustment to a threshold may be made. If the D', T and D bits provide either a 010 or a 101 pattern, the pattern may be considered a false transition. On detection of the false transition, an offset on the input of a device in the receiver can moved or adjusted to a lower bit error rate (BER) position. An offset may be provided to the input of a LIA in a receiver CDR to adjust a threshold level. In an embodiment, a 101 pattern may be considered noisy '1' bits and a 010 pattern may be considered noisy '0' bits. In an embodiment, a regulation scheme for noisy '1' bits and noisy '0' bits may be implemented in a bang-bang detector or using signals output from a bang-bang detector. In and embodiment, a BER setting may be adjusted to a different value based on detection of false transitions.

Figure 3:
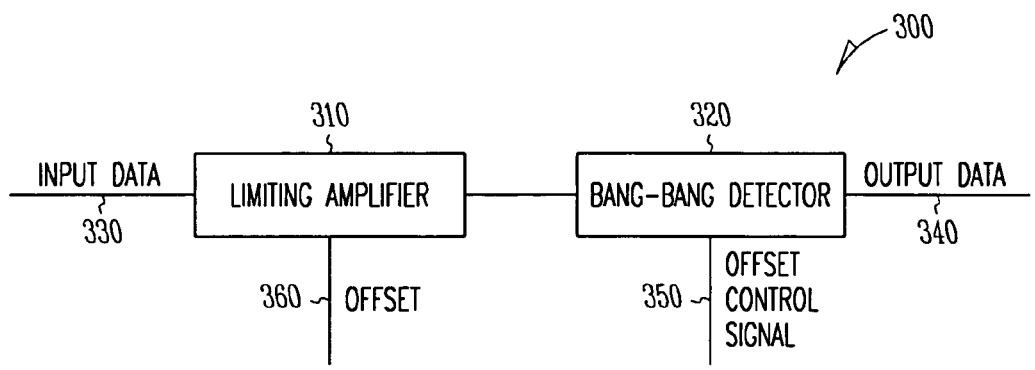
FIG. 3 shows a block diagram of an embodiment of an apparatus having a receiver that includes a limiting amplifier and a bang-bang detector to adjust the sampling of data.

FIG. 3 shows a block diagram of an embodiment of an apparatus having a receiver 300 that includes a limiting amplifier 310 and a bang-bang detector 320 to adjust the sampling of data. Input data 330 may be provided to limiting amplifier 310 that provides data to bang-bang detector 320. The input data may be from a phase detector. Consecutive data bits and a transition bit are examined in bang-bang detector 320 that provides output data 340. If false transitions are detected, bang-bang detector 320 may provide an offset control signal 350 to enable an offset 360 to limiting amplifier 310 to adjust a threshold for bit sampling. Offset control signal 350 may be a signal to another unit or module in receiver 300 that provides offset 360. Offset control signal 350 may be offset 360 provided to limiting amplifier 310. The regulation of the sampling position by this architecture may provide a dynamic adjustment of the offset that may lower the total system BER.

Figure 4:
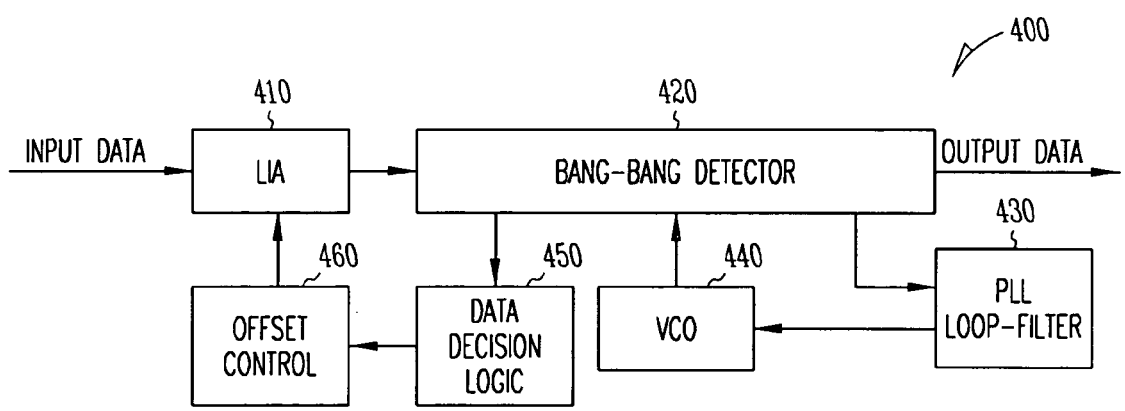
FIG. 4 shows a block diagram of an embodiment of features of a clock and data recovery of a receiver that includes a limiting amplifier and a bang-bang detector to adjust the sampling of data.

FIG. 4 shows a block diagram of an embodiment of features of a clock and data recovery 400 of a receiver that includes a limiting amplifier 410 and a bang-bang detector 420 to adjust sampling of data. Input data is provided to LIA 410 that provides data to bang-bang detector 420 that produces output data that may be used by other apparatus of a system. Operation of the bang-bang detector may be realized with a VCO 440 and a phase lock loop (PLL) loop-filter 430. Bang-bang detector 420 evaluates two consecutive sampled data and the transition between the sampled data. Data decision logic 450 may determine if false transitions occur at bang-bang detector 420 and may provide a control signal to offset control 460. Offset control 460 may be a chargepump that controls the offset in LIA 410. A charge pump may take the output from data decision logic 450 to push or pull current into a loop filter that pushes or pulls current into a loop filter that may provide a voltage as the offset. Offset control 460 may be a D/A converter with up/down counter to control the offset in LIA 410.

In an embodiment, data decision logic 450 may include logic circuitry that may be coupled to the circuitry in bang-bang detector 420 that examines consecutive data bits, D and D', and transition bit, T. In an embodiment, data decision logic 450 may be configured in a unit coupled to bang-bang detector 420. In an embodiment, data decision logic 450 may be configured in bang-bang detector 420. Data decision logic 450 may utilize unused information in a bang-bang detector to regulate input offset. The input offset may be regulated at LIA 410.

Figure 5:
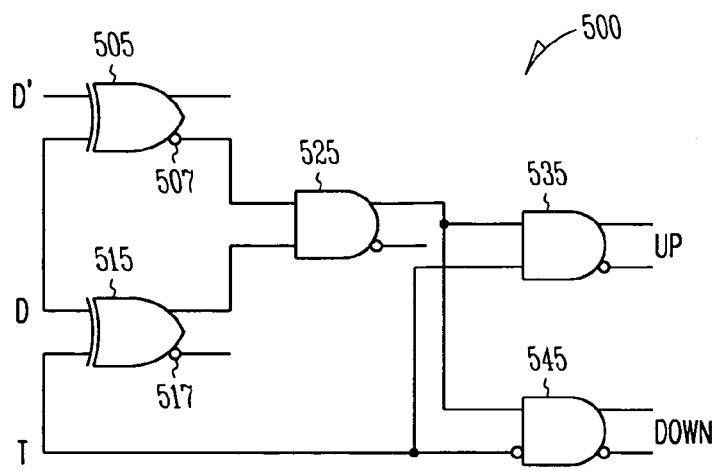
FIG. 5 shows an embodiment of logic circuitry to provide an offset to adjust the sampling of data.

FIG. 5 shows an embodiment of logic circuitry 500 to provide an offset to adjust the sampling of data. Logic circuitry 500 includes XOR gate 505 and XOR gate 515. An output of XOR gates 505 and 515 may include NOT circuitry 507 and 517, respectively, to invert an output of each of these XOR gates. XOR gate 505 includes inputs to receive sampled consecutive bits D and D'. XOR gate 515 includes inputs to receive sampled consecutive bit D and transition bit T. An AND gate 525 has an input to receive an output from XOR 505 through Not 507 and a input to receive an output from XOR gate 515. An output of AND gate 525 may be coupled as an input to an AND gate 535, which also has an input to receive the T bit. The output from AND gate 535 may provide an Up output. An output of AND gate 525 may also be coupled as an input to an AND gate 545, which also has an input to receive an inversion of the T bit. The inversion of the T bit may be provided by a NOT circuit 543 that may be coupled to an input of AND gate 545. The output from AND gate 545 may provide a Down output. The Up output may adjust the offset in a positive direction and the Down output may adjust the offset in a negative direction. In an embodiment, one of the Up output and the Down output is provided in that only one of the AND gates 535 and 545 providing these outputs are effectively on at a given time.

The Up and Down outputs from AND gates 535 and 545 may be directed to a chargepump as an offset control 460 in a manner similar to that shown in FIG. 4. The chargepump may control the offset in the LIA 410 shown in FIG. 4. The Up and Down outputs from AND gates 535 and 545 may be directed to a D/A converter with up/down counter. In an embodiment, logic circuitry 500 may be configured in data decision logic 450 of FIG. 4. In an embodiment, XOR gates 505 and 515 may be XOR gates available in a standard Bang-Bang. Adapting AND gates 525, 535, and 545 in an embodiment as illustrated in FIG. 5, the architecture of logic circuitry 500 may make use of unused information in a bang-bang detector to regulate an input offset.

Figure 6:
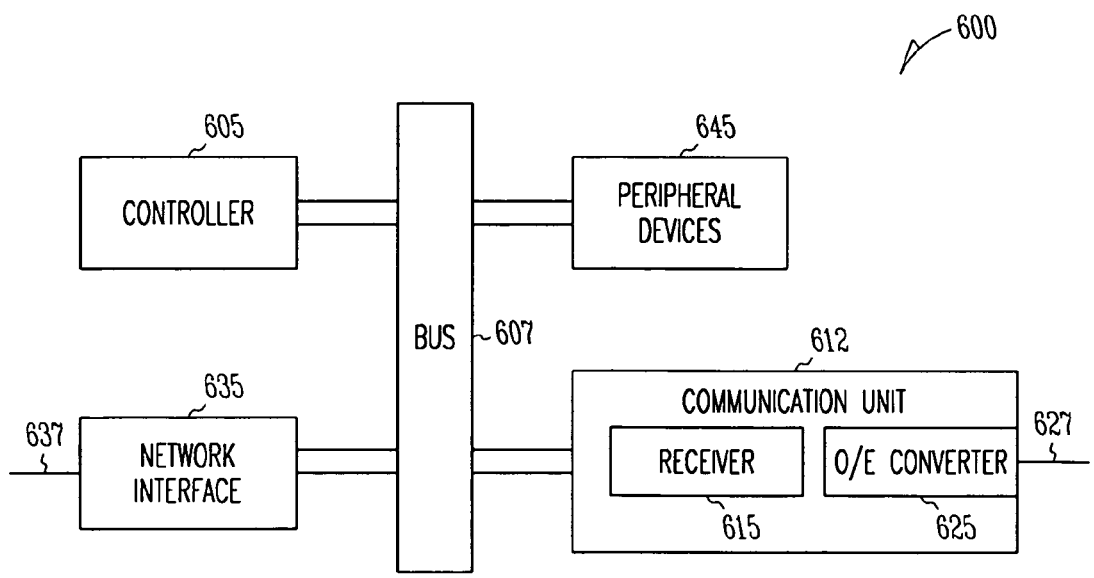
FIG. 6 illustrates a block diagram of an embodiment of a system that includes an apparatus having a receiver that includes a limiting amplifier and a bang-bang detector to adjust the sampling of data.

FIG. 6 illustrates a block diagram of an embodiment of a system 600 that includes an apparatus having an embodiment of a receiver that includes a limiting amplifier and a bang-bang detector to adjust the sampling of data. System 600 may include a controller 605, a communication unit 612, and a bus 607, where bus 607 provides electrical connectivity between controller 605 and communication unit 612. Bus 607 may be compatible with Peripheral Component Interconnect (PCI) or with PCI express. Bus 607 may be a parallel bus. Alternatively, system 600 may include controller 605 coupled to communication unit 612 via a serial bus. In an embodiment, controller 605 may include a processor. Communication unit 612 may include a connection to couple to medium 627 to receive data signals from a network. The network may be a wide area network, a local area network, a wireless network, a wired network, an optical network, or a combination thereof. For use with an optical network, communication unit 612 may include an O/E converter 625. O/E converter 625 may include a PIN device. O/E converter 625 may include a PIN device and a transimpedance amplifier. Communication unit 612 may include a receiver 615 having an embodiment of a limiting amplifier and a bang-bang detector to adjust a sampling level for received data, similar to those described herein. The bang-bang detector may enable an offset to the limiting amplifier to adjust the sampling of data to regulate the bit error rate of receiver 615. The offset may be used to regulate a BER setting of receiver 615. Receiver 615 may be configured in embodiment similar to that of FIGS. 3 and/or 4.

An embodiment of system 600 may include an additional peripheral device or devices 645 coupled to bus 607. Peripheral devices 645 may also include displays, memories, or other control devices that may operate in conjunction with controller 605. Alternatively, peripheral devices 645 may include displays, memories, or other control devices that may operate in conjunction with controller 605 and/or communication unit 612.

System 600 may include a network interface 635 coupled to controller 605 via parallel bus 607. In an embodiment, network interface 635 may be implemented as a network interface card, NIC. Network interface 635 may include a connection to couple to medium 637. Medium 637 may couple system 600 to a local area network. Medium 637 may couple system 600 to a wide area network. With system 600 coupled to medium 627 and medium 637, system may control transmission of data from one network to another network. System 600 may operate at line rates compatible with SONET, gigabit Ethernet, as well as fractional multiples of these rates and other line rates. System 600 may include, but is not limited to, information handling devices, wireless systems, telecommunication systems, fiber optic systems, electro-optic systems, and computers.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon reviewing and studying the above description.

What is claimed is:

1. A method comprising:
    detecting false transitions of data in a receiver, a false transition based on values of two sampled data bits of a same digital value and a value of a transition bit between the two sampled data bits; and
    regulating a bit error rate of the receiver using an offset based on detecting the false transitions.

2. The method of claim 1, wherein regulating a bit error rate includes adjusting a threshold to identify a bit as a one or a zero.

3. The method of claim 1, wherein detecting false transitions includes determining that the transition bit between the two sampled data bits has a bit value different from a bit value common to the two data bits.

4. The method of claim 1, wherein the method includes generating control signals in a bang-bang detector to provide the offset.

5. The method of claim 1, wherein the method includes providing the offset to a limiting amplifier under the control of a chargepump.

6. A method comprising:
    detecting false transitions of data in a receiver;
    regulating a bit error rate of the receiver using an offset based on detecting the false transitions; and
    providing the offset to a limiting amplifier under the control of a D/A converter.

7. An apparatus comprising:
    a receiver having a limiting amplifier and a bang-bang detector to control an offset to the limiting amplifier based on detection of false transitions in received data to regulate a bit error rate of the receiver, a false transition based on values of two sampled data bits of a same digital value and a value of a transition bit between the two sampled data bits.

8. The apparatus of claim 7, wherein the receiver includes logic circuitry to determine that the transition bit between the two sampled data bits has a bit value different from a bit value common to the two sampled data bits to provide the offset.

9. The apparatus of claim 8, wherein the bang-bang detector includes the logic circuitry.

10. The apparatus of claim 7, wherein the receiver includes a chargepump to provide the offset to the limiting amplifier.

11. The apparatus of claim 7, wherein the apparatus includes an optical-to-electrical converter to provide an electrical signal to the receiver.

12. The apparatus of claim 11, wherein the optical-to-electrical converter includes a PIN device.

13. An apparatus comprising:
    a receiver having a limiting amplifier and a bang-bang detector to control an offset to the limiting amplifier based on detection of false transitions in received data to regulate a bit error rate of the receiver, the receiver including logic circuitry to determine that a transition bit between two data bits has a bit value different from a bit value common to the two data bits to provide the offset, wherein the receiver includes a first AND gate coupled to an output of a first XOR gate of the bang-bang detector, the first XOR gate having an input to receive the transition bit and an input to receive one of the two data bits, the first AND gate being coupled to an output of a second XOR gate of the bang-bang detector through a NOT circuit, the second XOR gate having inputs to receive the two data bits.

14. The apparatus of claim 13, wherein the receiver includes:
    a second AND gate having an input to receive an output of the first AND gate and an input to receive the transition bit; and
    a third AND gate having an input to receive an output of the first AND gate and an input to receive an inversion of the transition bit.

15. The apparatus of claim 14, wherein the bang-bang detector includes the first, second, and third AND gates.

16. An apparatus comprising:
    a receiver having a limiting amplifier and a bang-bang detector to control an offset to the limiting amplifier based on detection of false transitions in received data to regulate a bit error rate of the receiver, wherein the receiver includes a D/A converter to provide the offset to the limiting amplifier.

17. A system comprising:
    an optical-to-electrical converter to provide received data in electrical form;
    a receiver having a limiting amplifier and a bang-bang detector to control an offset to the limiting amplifier based on detection of false transitions in the received data to regulate a bit error rate of the receiver;
    a controller communicatively coupled to the receiver;
    a network interface; and
    a parallel bus to which the controller and the network interface are communicatively coupled.

18. The system of claim 17, wherein the receiver includes logic circuitry to determine that a transition bit between two data bits has a bit value different from a bit value common to the two data bits to provide the offset.

19. The system of claim 18, wherein the receiver includes a first AND gate coupled to an output of a first XOR gate of the bang-bang detector, the first XOR gate having an input to receive the transition bit and an input to receive one of the two data bits, the first AND gate being coupled to an output of a second XOR gate of the bang-bang detector through a NOT circuit, the second XOR gate having inputs to receive the two data bits.

20. The system of claim 19, wherein the receiver includes:
    a second AND gate having an input to receive an output of the first AND gate and an input to receive the transition bit; and
    a third AND gate having an input to receive an output of the first AND gate and an input to receive an inversion of the transition bit.

21. The system of claim 20, wherein the bang-bang detector includes the first, second, and third AND gates.

22. The system of claim 17, wherein the receiver includes a clock and data recovery that includes the limiting amplifier and the bang-bang detector.

23. The system of claim 17, wherein the optical-to-electrical converter includes a PIN device.

24. The system of claim 17, wherein the optical-to-electrical converter includes a PIN device and a transimpedance amplifier.

25. The system of claim 17, wherein the controller includes a processor.

26. The system of claim 17, wherein the network interface includes a network interface to distribute the received data in electrical form to a local area network.

27. The system of claim 17, wherein the network interface is compatible with PCI.

28. The system of claim 17, wherein the network interface is compatible with PCI express.

* * * * *